(12) United States Patent
Hou et al.

(10) Patent No.: US 10,219,420 B2
(45) Date of Patent: Feb. 26, 2019

(54) INTEGRATED CIRCUIT CHIP EXTRACTOR

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Yongkang Hou, Beijing (CN); Yu Zhang, Beijing (CN); Jianlei Yang, Beijing (CN)

(73) Assignees: BOE TECHNOLOGY GROUP CO., LTD. (CN); HEFEI BOE OPTOELECTRONICS TECHNOLOGY CO., LTD. (CN)

( * ) Notice: Subject to any disclaimer, the term of this patent is extended or adjusted under 35 U.S.C. 154(b) by 212 days.

(21) Appl. No.: 15/139,185

(22) Filed: Apr. 26, 2016

(65) Prior Publication Data
US 2016/0353623 A1    Dec. 1, 2016

(30) Foreign Application Priority Data

Jun. 1, 2015    (CN) .......................... 2015 1 0296410

(51) Int. Cl.
*B23P 19/00*  (2006.01)
*H05K 13/04*  (2006.01)
*G02F 1/13*   (2006.01)
*G02F 1/1345* (2006.01)

(52) U.S. Cl.
CPC ....... *H05K 13/0486* (2013.01); *G02F 1/1309* (2013.01); *G02F 1/13454* (2013.01); *Y10T 29/53274* (2015.01)

(58) Field of Classification Search
CPC ......... Y10T 29/53274; Y10T 29/53283; Y10T 29/49821; Y10T 29/53; G02F 1/1309

USPC ............ 29/762, 278, 426.1, 426.3, 743, 764
See application file for complete search history.

(56) References Cited

U.S. PATENT DOCUMENTS

| | | | | |
|---|---|---|---|---|
| 4,828,162 A * | 5/1989 | Donner | ............... | H05K 13/0486 228/180.21 |
| 9,597,711 B2 * | 3/2017 | Das | ........................... | B07B 1/28 |
| 2010/0162543 A1 | 7/2010 | Dilo | | |
| 2014/0076995 A1 | 3/2014 | Wang | | |

FOREIGN PATENT DOCUMENTS

| CN | 1503343 A   | 6/2004  |
|----|-------------|---------|
| CN | 2651936 Y   | 10/2004 |
| CN | 104035223 A | 9/2014  |
| CN | 204075445 U | 1/2015  |
| CN | 104476003 A | 4/2015  |

OTHER PUBLICATIONS

Office Action in Chinese Patent Application No. 201510296410.X, dated Nov. 2, 2016.
Second Office Action for Chinese Application No. 201510296410.X, dated Jun. 8, 2017, 8 Pages.

* cited by examiner

*Primary Examiner* — Thiem Phan
(74) *Attorney, Agent, or Firm* — Brooks Kushman P.C.

(57) ABSTRACT

The present disclosure relates to an IC chip extractor for removing an IC chip from a panel. The IC chip extractor includes a base plate and a heating head arranged on the base plate. The heating head includes a protrusion protruded from an end of the heating head and a hook arranged at an end of the protrusion, the hook is capable of being in contact with a bottom of a portion the IC chip adjacent to a center of the panel.

11 Claims, 4 Drawing Sheets

INTEGRATED CIRCUIT CHIP EXTRACTOR

CROSS-REFERENCE TO RELATED APPLICATION

The present application claims a priority of the Chinese patent application No. 201510296410.X filed on Jun. 1, 2015, which is incorporated herein by reference in its entirety.

TECHNICAL FIELD

The present disclosure relates to the manufacture of a display device, in particular to an integrated circuit (IC) chip extractor and a method for operating the same.

BACKGROUND

In the related art, an operator holds a panel, and after an IC chip is in contact with a heating head of an IC chip extractor, the operator pushes the panel, so as to press the IC chip against the heat, thereby to remove the IC chip. However, during the extraction, the IC chip may easily be broken, and an electrode of the panel may be damaged by resultant debris. At this time, the panel has to be scrapped.

SUMMARY

An object of the present disclosure is to provide an IC chip extractor and a method for operating the same, so as to prevent an electrode of a panel from being damaged by debris of an IC chip.

In one aspect, the present disclosure provides in some embodiments an IC chip extractor for removing an IC chip from a panel, including a base plate and a heating head arranged on the base plate. The heating head includes a protrusion protruded from an end of the heating head and a hook arranged at an end of the protrusion, the hook is capable of being in contact with a bottom of a portion of the IC chip adjacent to a center of the panel.

Alternatively, a first via-hole configured to receive a heating rod is arranged in the heating head.

Alternatively, a temperature sensor configured to measure a temperature of the heating head is arranged in the heating head.

Alternatively, a second via-hole configured to receive the temperature sensor is arranged in the heating head.

Alternatively, delimiting struts are arranged on the base plate and are capable of abutting against an edge of the panel so as to enable the hook to be at a position corresponding to the IC chip.

Alternatively, the protrusion is arranged at a first side of the heating head, the delimiting struts are arranged at a second side and a third side of the heating head adjacent to the first side, and a connection line between the delimiting struts at the second side and the third side of the heating head is parallel to an edge of the portion of the hook in contact with the IC chip.

Alternatively, delimiting grooves are arranged in the base plate, and the delimiting struts are movably arranged in the delimiting groove.

Alternatively, the base plate is connected to the heating head via a screw.

Alternatively, the second side and the third side of the heating head are located at both sides of the heating head in a first direction respectively, and the first side of the heating head is located at a side of the heating head in a third direction perpendicular to the first direction.

Alternatively, the delimiting struts move in the delimiting groove along a second direction perpendicular to the first direction and the third direction.

Alternatively, the connection line between the delimiting struts at the second side and the third side of the heating head extends in the first direction.

In another aspect, the present disclosure provides in some embodiments a method for operating the above-mentioned IC chip extractor, including steps of: moving a panel, so as to enable a bottom of a portion of the IC chip adjacent to a center of the panel to be in contact with a hook of a heating head; heating the IC chip; and moving the panel in a direction from an edge of a side of the panel where the IC chip is located to the center of the panel, so as to remove the IC chip from the panel by a force applied by the heating head to the IC chip in a direction opposite to a movement direction of the panel.

Alternatively, the step of moving the panel, so as to enable the bottom of the portion of the IC chip adjacent to the center of the panel to be in contact with the hook of the heating head includes: moving the panel, so as to enable a side surface of the side of the panel where the IC chip is located to abut against delimiting struts, thereby to enable a protrusion of the heating head to be at a position corresponding to the IC chip; and moving the panel, so as to enable the bottom of the portion of the IC chip adjacent to the center of the panel to be in contact with the hook of the heating head.

Alternatively, the step of heating the IC chip includes heating the IC chip with the heating head, monitoring a temperature of the heating head, and stopping heating the IC chip in the case that the temperature of the heating head reaches a predetermined temperature.

According to the embodiments of the present disclosure, the heating head is provided with the hook which is in contact with the bottom of the portion of the IC chip adjacent to the center of the panel. As a result, during the extraction of the IC chip from the panel, it is able to prevent an electrode of the panel from being damaged by the debris of the IC chip.

DETAILED DESCRIPTION OF THE EMBODIMENTS

The present disclosure will be described hereinafter in conjunction with the drawings and embodiments. The following embodiments are for illustrative purposes only, but shall not be used to limit the scope of the present disclosure.

Figure 1A:
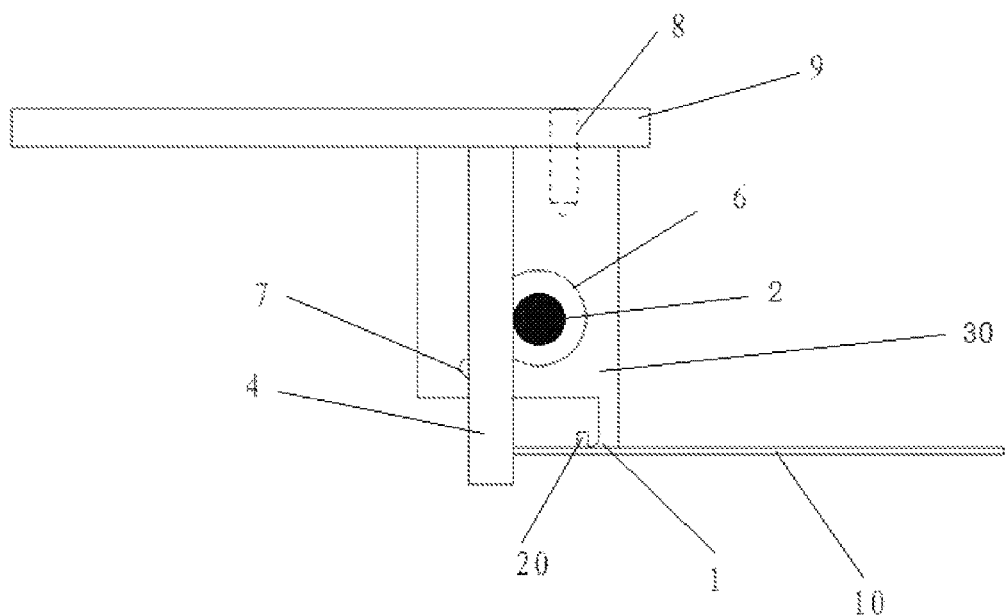
FIG. 1a is a side view of an IC chip extractor according to some embodiments of the present disclosure.
Figure 1B:
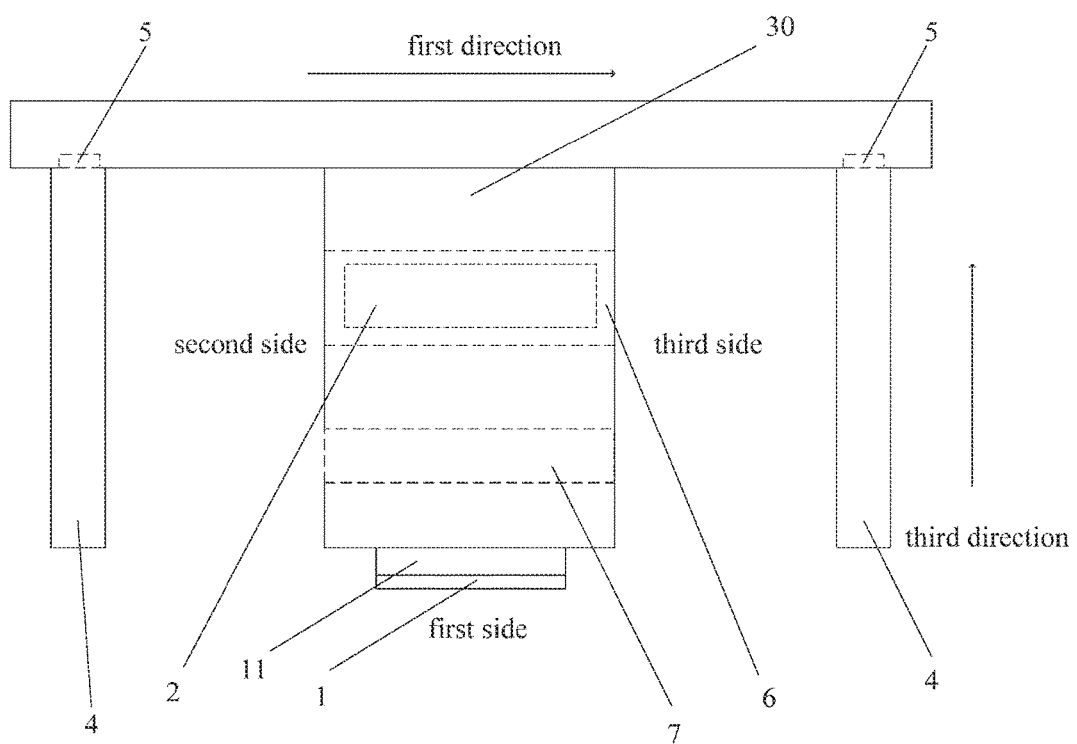
FIG. 1b is another side view of the IC chip extractor according to some embodiments of the present disclosure.

As shown in FIG. 1a, the present disclosure provides in some embodiments an IC chip extractor for removing an IC chip 20 from a panel 10. The IC chip extractor includes a base plate 9 and a heating head 30 arranged on the base plate 9. As shown in FIG. 1b, the heating head 30 includes a protrusion 11 protruded from an end of the heating head 30, and the protrusion 11 is provided at its end with a hook 1 capable of being in contact with a bottom of a portion of the IC chip 20 adjacent to a center of the panel 10.

According to the embodiments of the present disclosure, the heating head 30 is provided with the hook 1 which is in contact with the bottom of the portion of the IC chip 20 adjacent to the center of the panel 10. During the extraction of the IC chip 20 from the panel 10, forces are applied to the IC chip 20 in a direction from the center of the panel 10 to its edge and in an upward direction, so an electrode of the panel may not be damaged by debris of the IC chip 20. In addition, when the hook is in contact with the bottom portion of the IC chip, it is able to facilitate the extraction of the IC chip from the panel.

Alternatively, the heating head 30 is provided with a first via-hole 6 for receiving a heating rod 2. When the heating rod 2 is arranged in the heating head 30, the entire heating head 30 may be heated uniformly, thereby to heat an anisotropic conductive adhesive arranged between the IC chip 20 and the panel 10 and facilitate the extraction of the IC chip 20 from the panel 10.

Alternatively, the heating head is provided with a temperature sensor 3 for measuring a temperature of the heating head. The temperature sensor 3 is provided so as to prevent the anisotropic conductive adhesive from being cured due to an excessive temperature, thereby to facilitate the subsequent removal of the anisotropic conductive adhesive.

Alternatively, the temperature sensor 3 is received in a second via-hole 7 in the heating head, thereby improving an accuracy of the temperature measurement.

Alternatively, on the base plate 9 is provided delimiting struts 4 capable of abutting against an edge of the panel 10 so as to enable the hook 1 to be at a position corresponding to the IC chip 20.

Through the delimiting struts 4, the hook 1 may merely move at a peripheral region of the panel 10 where wires are located during the extraction of the IC chip 20 without entering into a display region in the center of the panel 10 and thereby damage a polarizer of the panel 10.

Alternatively, the protrusion 11 is arranged at a first side of the heating head 30, the delimiting struts 4 are arranged at a second side and a third side of the heating head 30 adjacent to the first side, and a connection line between the delimiting struts 4 at the second side and the third side of the heating head 30 is parallel to an edge of a portion of the hook 1 in contact with the IC chip 20. In some embodiments of the present disclosure, as shown in FIG. 1b, the second side and the third side of the heating head are located at both sides of the heating head in a first direction respectively, and the first side of the heating head is located at a side of the heating head in a third direction.

The two delimiting struts 4 are provided so as to enable the hook 1 to be in stable contact with the bottom portion of the IC chip 20, thereby to prevent the IC chip 20 from being removed imperfectly when the IC chip 20 is oblique to the hook 1 and prevent the display region of the panel 10 at the center thereof from being damaged.

Alternatively, the base plate 9 is provided with delimiting grooves 5, and the delimiting struts 4 are movably arranged in the delimiting grooves 5. In some embodiments of the present disclosure, as shown in FIG. 2b, the delimiting struts 4 may move in the delimiting grooves 5 in a second direction.

Alternatively, when the delimiting struts 4 arranged at the second side and the third side move in the delimiting grooves 5 in the second direction, the connection line between the two delimiting struts 4 is always parallel to an edge of a portion of the hook 1 in contact with the IC chip 20.

Figure 2A:
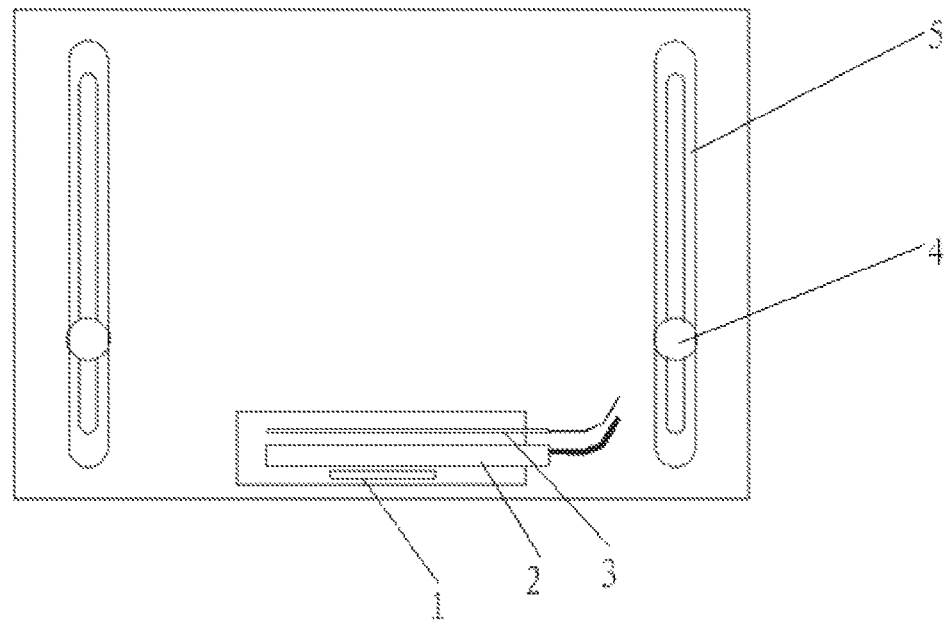
FIG. 2a is a top view of the IC chip extractor according to some embodiments of the present disclosure.
Figure 2B:
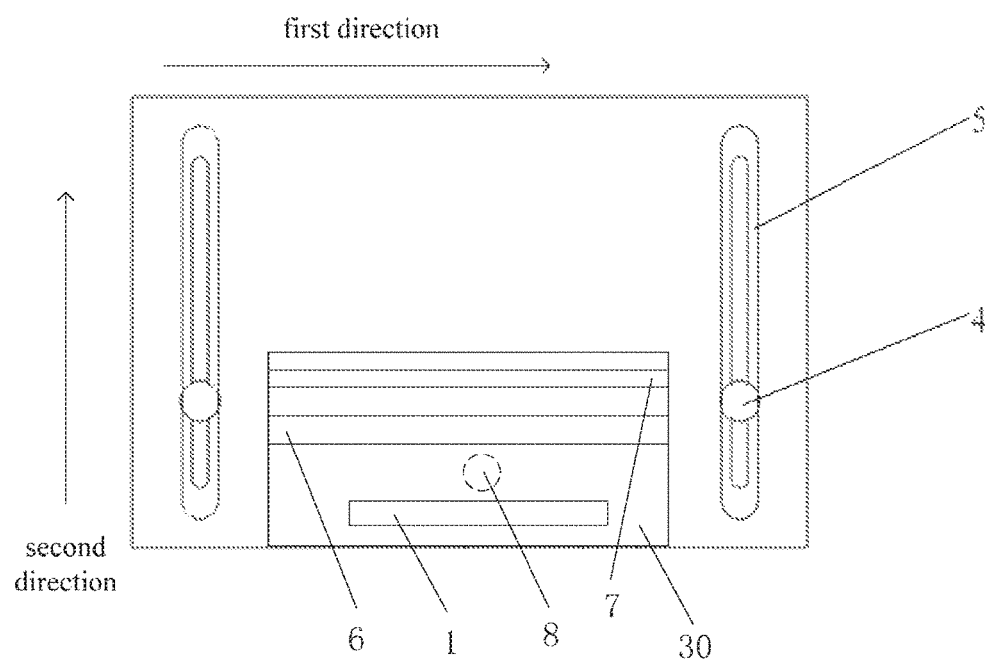
FIG. 2b is another top view of the IC chip extractor according to some embodiments of the present disclosure.

In some embodiments of the present disclosure, as shown in FIGS. 1b and 2b, the first direction, the second direction and the third direction are perpendicular to each other.

When the delimiting struts 4 are movably arranged in the delimiting grooves 5, it is able to apply the IC chip extractor to the panels in various sizes and to the extraction of the IC chip at different positions on the display panel.

Alternatively, the base plate 9 is connected to the heating head 30 via a screw. A dotted line in FIG. 1a represents a screw 8 for connecting the base plate 9 to the heating head. It should be appreciated that, the base plate 9 may be connected to the heating head in various modes but not limited to the above-mentioned screw joint mode.

Figure 3:
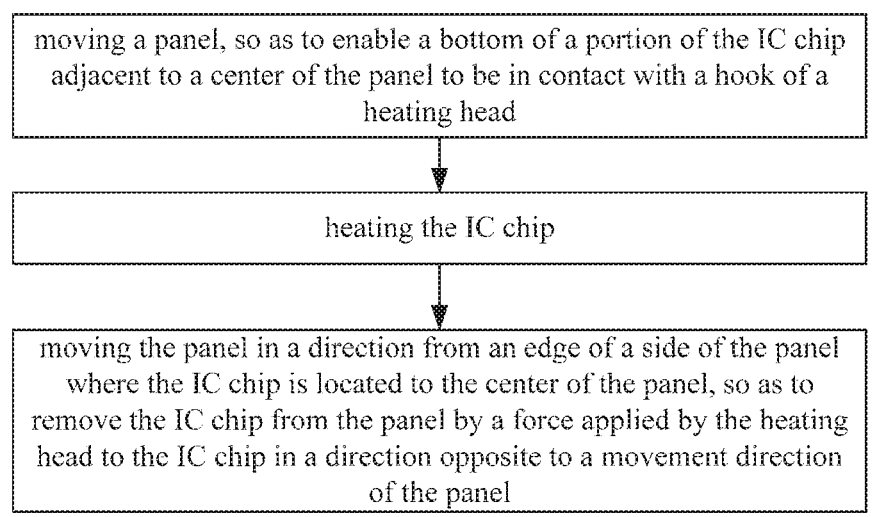
FIG. 3 is a flow chart of a method for operating the IC chip extractor according to some embodiments of the present disclosure.

As shown in FIG. 3, the present disclosure further provides a method for operating the above-mentioned IC chip extractor, which includes steps of: moving the panel, so as to enable a bottom of a portion of the IC chip adjacent to the center of the panel to be in contact with the hook of the heating head; heating the IC chip; and moving the panel in a direction from an edge of a side of the panel where the IC chip is located to the center of the panel, so as to remove the IC chip from the panel by a force applied by the heating head to the IC chip in a direction opposite to a movement direction of the panel.

Alternatively, the step of moving the panel, so as to enable the bottom of the portion of the IC chip adjacent to the center of the panel to be in contact with the hook of the heating head includes: moving the panel, so as to enable a side surface of the side of the panel where the IC chip is located to abut against the delimiting struts, thereby to enable the protrusion of the heating head to be at a position corresponding to the IC chip; and moving the panel, so as to enable the bottom of the portion of the IC chip adjacent to the center of the panel to be in contact with the hook of the heating head.

Alternatively, the step of heating the IC chip includes heating the IC chip with the heating head, monitoring a temperature of the heating head, and stopping heating the IC chip when the temperature of the heating head reaches a predetermined temperature.

The panel may be moved manually or by a mechanical arm, so as to enable a side surface of a side of the panel where the IC chip is located to abut against the delimiting struts, thereby to enable the protrusion of the heating head to be at a position corresponding to the IC chip. Then, the panel may be moved, so as to enable the bottom of the portion of the IC chip adjacent to the center of the panel to be in contact with the hook of the heating head. The IC chip (i.e., the anisotropic conductive adhesive between the IC chip and the panel) may be heated, and the temperature of the heating head may be monitored. When the temperature of the heating head reaches the predetermined temperature, the heating of the IC chip may be stopped. At this time, the anisotropic conductive adhesive may be melted to an extent sufficient for separating the IC chip from the panel (the temperature is not high enough to cure the anisotropic conductive adhesive). Then, the panel may be moved in a direction from an edge of a side of the panel where the IC chip is located to the center of the panel, so as to remove the IC chip from the panel by a force applied by the heating head to the IC chip in a direction opposite to a movement direction of the panel (the movement direction of the panel is shown by an arrow in FIG. 3).

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. An integrated circuit (IC) chip extractor for removing an IC chip from a panel, comprising a base plate and a heating head arranged on the base plate, wherein the heating head comprises a protrusion protruded from an end of the heating head and a hook arranged at an end of the protrusion, the hook is capable of being in contact with a bottom of a portion of the IC chip adjacent to a center of the panel;
wherein delimiting struts are arranged on the base plate and are capable of abutting against an edge of the panel so as to enable the hook to be at a position corresponding to the IC chip.

2. The IC chip extractor according to claim 1, wherein a first via-hole configured to receive a heating rod is arranged in the heating head.

3. The IC chip extractor according to claim 1, wherein a temperature sensor configured to measure a temperature of the heating head is arranged in the heating head.

4. The IC chip extractor according to claim 3, wherein a second via-hole configured to receive the temperature sensor is arranged in the heating head.

5. The IC chip extractor according to claim 1, wherein the protrusion is arranged at a first side of the heating head, the delimiting struts are arranged at a second side and a third side of the heating head adjacent to the first side, and a connection line between the delimiting struts at the second side and the third side of the heating head is parallel to an edge of the portion of the hook in contact with the IC chip.

6. The IC chip extractor according to claim 5, wherein delimiting grooves are arranged in the base plate, and the delimiting struts are movably arranged in the delimiting grooves.

7. The IC chip extractor according to claim 6, wherein the second side and the third side of the heating head are located at both sides of the heating head in a first direction respectively, and the first side of the heating head is located at a side of the heating head in a third direction perpendicular to the first direction.

8. The IC chip extractor according to claim 7, wherein the delimiting struts move in the delimiting groove along a second direction perpendicular to the first direction and the third direction.

9. The IC chip extractor according to claim 7, wherein the connection line between the delimiting struts at the second side and the third side of the heating head extends in the first direction.

10. The IC chip extractor according to claim 1, wherein delimiting grooves are arranged in the base plate, and the delimiting struts are movably arranged in the delimiting groove.

11. The IC chip extractor according to claim 1, wherein the base plate is connected to the heating head via a screw.

* * * * *